United States Patent
Das

(10) Patent No.: US 9,886,341 B2
(45) Date of Patent: *Feb. 6, 2018

(54) OPTIMIZING RECLAIMED FLASH MEMORY

(71) Applicant: SanDisk Technologies LLC, Plano, TX (US)

(72) Inventor: Srikanta Das, Bangalore (IN)

(73) Assignee: SanDisk Technologies LLC, Plano, TX (US)

(*) Notice: Subject to any disclaimer, the term of this patent is extended or adjusted under 35 U.S.C. 154(b) by 109 days.

This patent is subject to a terminal disclaimer.

(21) Appl. No.: 14/662,321

(22) Filed: Mar. 19, 2015

(65) Prior Publication Data

US 2016/0188404 A1 Jun. 30, 2016

(30) Foreign Application Priority Data

Dec. 31, 2014 (IN) .......................... 6781/CHE/2014

(51) Int. Cl.
*G11C 29/00* (2006.01)
*G06F 11/10* (2006.01)
*G11C 11/00* (2006.01)

(52) U.S. Cl.
CPC ........ *G06F 11/1048* (2013.01); *G11C 11/005* (2013.01)

(58) Field of Classification Search
CPC .......................... G06F 11/1048; G11C 11/005
See application file for complete search history.

(56) References Cited

U.S. PATENT DOCUMENTS

| | | | | |
|---|---|---|---|---|
| 4,535,455 | A * | 8/1985 | Peterson | G06F 11/073 714/48 |
| 5,949,553 | A * | 9/1999 | Iimori | G03G 15/553 358/439 |
| 2013/0019076 | A1 * | 1/2013 | Amidi | G06F 11/1441 711/162 |

OTHER PUBLICATIONS

A dual-page programming scheme for high-speed . . .—IEEE Xplore K Takeuchi et al., "A dual-page programming scheme for high-speed Multigigabit-Scale NAND Flash memories," IEEE, pp. 744-751; 2001.*

* cited by examiner

*Primary Examiner* — Guy Lamarre
(74) *Attorney, Agent, or Firm* — Brinks Gilson & Lione

(57) ABSTRACT

A memory system or flash card may optimize usage of reclaimed memory. The optimization may include lists for Uncorrectable Error Correction Code (UECC) and Correctable Error Correction Code (CECC) that can be used along with a dual programming scheme. Dual programming may be utilized for blocks on the lists, but not for blocks that are not on the lists. The lists can be updated by reading data programmed to blocks on the lists.

11 Claims, 9 Drawing Sheets

OPTIMIZING RECLAIMED FLASH MEMORY

PRIORITY

This application claims priority to Indian Patent Application No. 6781/CHE/2014, entitled "OPTIMIZING RECLAIMED FLASH MEMORY," filed on Dec. 31, 2014, the entire disclosure of which is hereby incorporated by reference.

TECHNICAL FIELD

This application relates generally to memory devices. More specifically, this application relates to improving the performance of reclaimed non-volatile semiconductor flash memory by maintaining lists of potential bad blocks.

BACKGROUND

Non-volatile memory systems, such as flash memory, have been widely adopted for use in consumer products. Flash memory may be found in different forms, for example in the form of a portable memory card that can be carried between host devices or as a solid state disk (SSD) embedded in a host device. Flash memory may be written in pages and erased in blocks, so once a page is written, a rewrite may require the whole block to be erased. Rewrites may be necessary if there is a write error or failure. For example, NAND defects including broken word lines (WL) or wordline to wordline (WL-WL) shorts may result in data errors. In some instances, a portion of memory may be completely discarded despite being at least partially useable. Discarded memory may be reclaimed if the quality and performance of the discarded memory can be optimized.

SUMMARY

A memory system or flash card may optimize usage of reclaimed memory. The optimization may include lists for Uncorrectable Error Correction Code (UECC) and Correctable Error Correction Code (CECC) that can be used along with a dual programming scheme. Dual programming may be utilized for blocks on the lists, but not for blocks that are not on the lists. The lists can be updated by reading data programmed to blocks on the lists, such that blocks with no errors are removed from the list.

DESCRIPTION OF THE EMBODIMENTS

The memory system and methods described monitor the health of memory and the user data stored by detecting and recording a number of bits in error for each block. This detection can be used to determine where user data should be programmed and which blocks should be cycled. The recorded erratic bits may be updated after programming. When the erratic bits exceed a threshold for a particular block, that block may be cycled or retired. An erratic bit is a bit that is not programmed to the desired state. In other words, when there is an attempt to program a bit is to a certain state, but a subsequent read of that bit results in a different state, then the bit is erratic or in error.

Figure 1A:
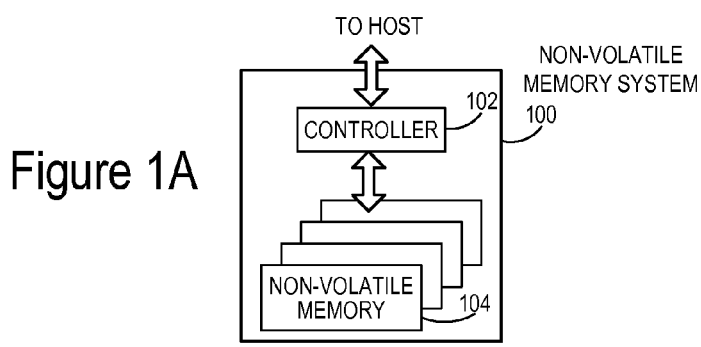
FIG. 1A is a block diagram illustrating a non-volatile memory system.

FIG. 1A is a block diagram illustrating a non-volatile memory system according to an embodiment of the subject matter described herein. Referring to FIG. 1A, non-volatile memory system 100 includes a controller 102 and one or more non-volatile memory die 104. As used herein, the term die refers to the set of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

Examples of host systems include, but are not limited to, personal computers (PCs), such as desktop or laptop and other portable computers, tablet computers, mobile devices, cellular telephones, smartphones, personal digital assistants (PDAs), gaming devices, digital still cameras, digital movie cameras, and portable media players. For portable memory card applications, a host may include a built-in receptacle for one or more types of memory cards or flash drives, or a host may require adapters into which a memory card is plugged. The memory system may include its own memory controller and drivers but there may also be some memory-only systems that are instead controlled by software executed by the host to which the memory is connected. In some memory systems containing the controller, especially those embedded within a host, the memory, controller and drivers are often formed on a single integrated circuit chip. The host may communicate with the memory card using any communication protocol such as but not limited to Secure Digital (SD) protocol, Memory Stick (MS) protocol and Universal Serial Bus (USB) protocol.

The controller 102 can take the form of a microprocessor or processor and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or software to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory technologies, now known or later developed. Also, the memory cells can be arranged in a two-dimensional or three-dimensional fashion.

The interface between controller 102 and non-volatile memory die 104 may be any suitable flash interface, such as Toggle Mode 200, 400, or 800. In one embodiment, system 100 may be a card based system. Examples of commercially available removable flash memory cards include the CompactFlash (CF), the MultiMediaCard (MMC), Secure Digital (SD), miniSD, Memory Stick, SmartMedia, TransFlash, and microSD cards. Although each of these cards may have a unique mechanical and/or electrical interface according to its standardized specifications, the flash memory system included in each may be similar. Each of these memory cards and flash drives may include controllers that interface with the host and control operation of the flash memory within them.

The flash memory may be embedded within the host, such as in the form of a solid state disk (SSD) drive installed in a personal computer. Alternatively, the memory 102 may be in the form of a flash memory card that is removably connected to the host. In an alternate embodiment, system 100 may be part of an embedded memory system.

Although in the example illustrated in FIG. 1A, non-volatile memory system 100 (sometimes referred to herein as a storage module) includes a single channel between controller 102 and non-volatile memory die 104, the subject matter described herein is not limited to having a single memory channel. For example, in some NAND memory system architectures, 2, 4, 8 or more NAND channels may exist between the controller and the NAND memory device, depending on controller capabilities. In any of the embodiments described herein, more than a single channel may exist between the controller and the memory die, even if a single channel is shown in the drawings.

Figure 1B:
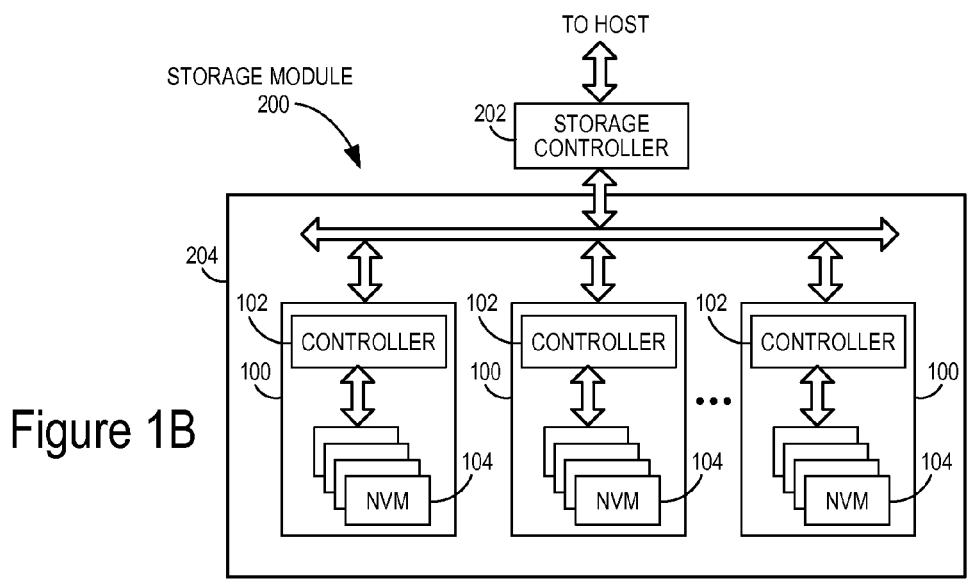
FIG. 1B illustrates a storage module that includes a plurality of non-volatile memory systems.

FIG. 1B illustrates a storage module 200 that includes a plurality of non-volatile memory systems 100. As such, storage module 200 may include a storage controller 202 that interfaces with a host and with memory system 204, which includes a plurality of non-volatile memory systems 100. The interface between storage controller 202 and non-volatile memory systems 100 may be a bus interface, such as a serial advanced technology attachment (SATA) or peripheral component interface express (PCIe) interface. Storage system 200 illustrated in FIG. 1B, in one embodiment, may be a solid state drive (SSD), such as found in portable computing devices, such as laptop computers, tablet computers, and mobile phones.

Figure 1C:
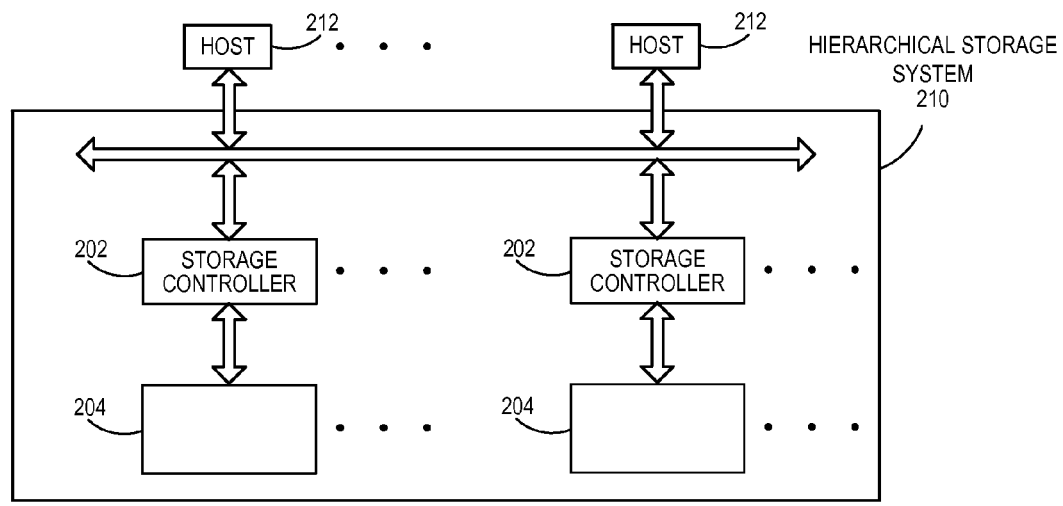
FIG. 1C is a block diagram illustrating a hierarchical storage system.

FIG. 1C is a block diagram illustrating a hierarchical storage system according to an embodiment. Referring to FIG. 1C, a hierarchical storage system 210 includes a plurality of storage controllers 202, each of which control a respective memory system 204. Host systems 212 may access memories within the storage system via a bus interface. In one embodiment, the bus interface may be a serial attached SCSI (SAS) or fiber channel over Figure (FCoE) interface. In one embodiment, the system illustrated in FIG. 1C may be a rack mountable mass storage system that is accessible by multiple host computers, such as would be found in a data center or other location where mass storage is needed.

Figure 2A:
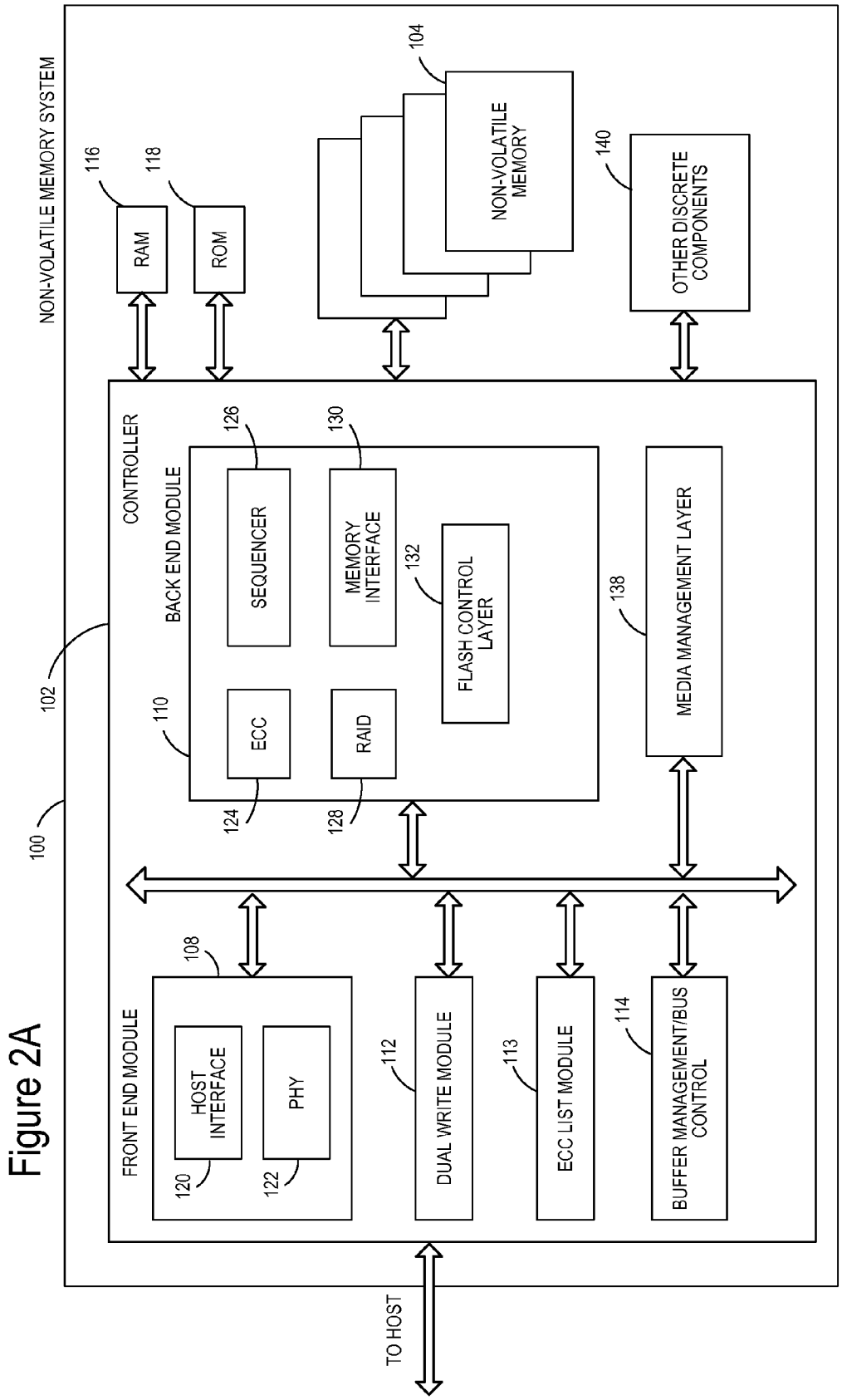
FIG. 2A is a block diagram illustrating exemplary components of controller.

FIG. 2A is a block diagram illustrating exemplary components of controller 102 in more detail. Referring to FIG. 2A, controller 102 includes a front end module 108 that interfaces with a host, a back end module 110 that interfaces with the one or more non-volatile memory die 104, and various other modules that perform functions which will now be described in detail. In the illustrated example, these modules include a dual write module 112 and an Error Correction Code (ECC) list module 113. The dual write module 112 allows for a dual write/programming operation in which data is written twice in case there is an error. Dual write/programming is further described in U.S. patent application Ser. No. 14/291,560, filed on May 30, 2014, entitled "PROTECTION SCHEME WITH DUAL PROGRAMMING OF A MEMORY SYSTEM", the entire disclosure of which is herein incorporated by reference. The ECC module 113 may track blocks that are either an Uncorrectable ECC (UECC) and/or a Correctable ECC (CECC) by maintaining a list of those blocks. That list may then be used to determine which blocks should be subject to dual write/programming. The functions of the dual write module 112 and the ECC list module 113 are further described below and may be performed for the controller 102. A buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller. Front end module 108 includes a host interface 120 and a physical layer interface (PHY) 122 that provide the electrical interface with the host or next level memory controller.

Back end module 110 includes an error correction controller (ECC) engine 124 that performs encoding on the data bytes received from the host, and decoding and error correction on the data bytes read from the non-volatile memory. The ECC engine 124 may operate in conjunction with the ECC list module 113. The ECC engine 124 may determine the ECCs while the ECC list module 113 may record which blocks have an ECC. The ECC engine 124 and the ECC list module 113 may be combined in an alternative embodiment.

A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a dual data rate (DDR) interface, such as a Toggle Mode 200, 400, or 800 interface. A flash control layer 132 controls the overall operation of back end module 110.

Additional components of system 100 illustrated in FIG. 2A include media management layer (MML) 138 (also referred to as the flash transformation layer), which performs wear leveling of memory cells of non-volatile memory die 104. System 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

The FTL or MML 138 may be integrated as part of the flash management that may handle flash errors and interfacing with the host. In particular, MML may be a module in flash management and may be responsible for the internals of NAND management. In particular, the MML 138 may include an algorithm in the memory device firmware which translates writes from the host into writes to the flash memory 104. The MML 138 may be needed because: 1) the flash memory may have limited endurance; 2) the flash memory 104 may only be written in multiples of pages; and/or 3) the flash memory 104 may not be written unless it is erased as a block. The MML 138 understands these potential limitations of the flash memory 104 which may not be visible to the host. Accordingly, the MML 138 attempts to translate the writes from host into writes into the flash memory 104. As described below, erratic bits may be identified and recorded using the MML 138. This recording of erratic bits can be used for evaluating the health of blocks.

Figure 2B:
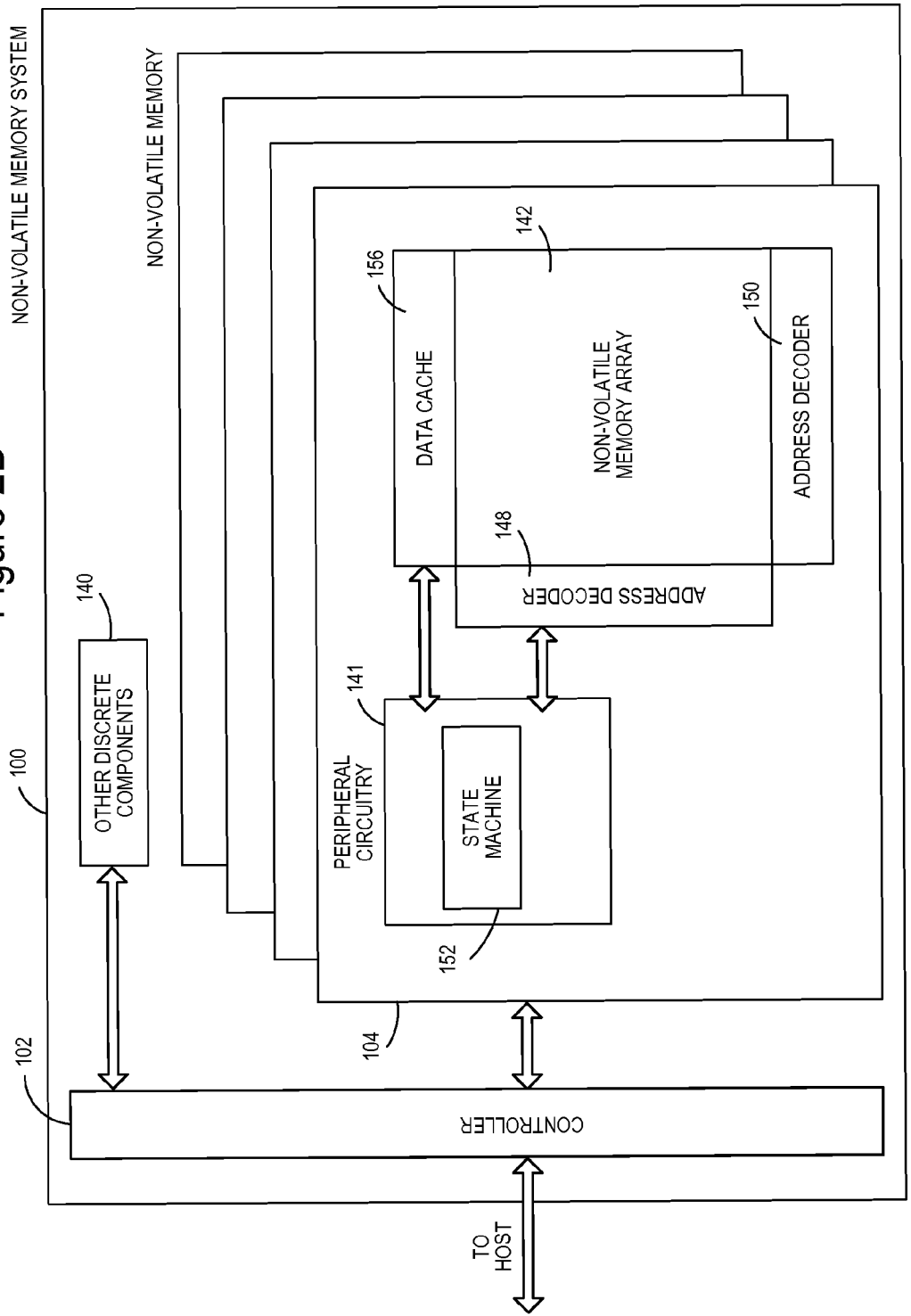
FIG. 2B is a block diagram illustrating exemplary components of non-volatile memory die.

FIG. 2B is a block diagram illustrating exemplary components of non-volatile memory die 104 in more detail. Referring to FIG. 2B, non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102. The state machine 152 may generate/identify erratic bits as further described below. Those erratic bits may be stored for further reference. Non-volatile memory die 104 further includes a data cache 156 that caches data.

Figure 3:
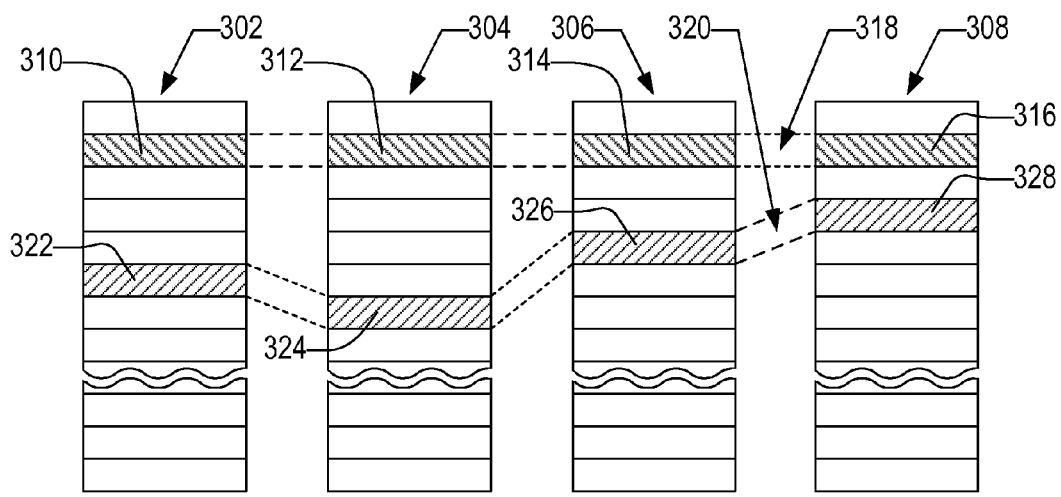
FIG. 3 is an example physical memory organization of the system of FIGS. 1A-2B.

FIG. 3 conceptually illustrates an organization of the flash memory 116 (FIG. 1) as a cell array. The flash memory 116 may include multiple memory cell arrays which are each separately controlled by a single or multiple memory controllers 118. Four planes or sub-arrays 302, 304, 306, and 308 of memory cells may be on a single integrated memory cell chip, on two chips (two of the planes on each chip) or on four separate chips. The specific arrangement is not important to the discussion below. Of course, other numbers of planes, such as 1, 2, 8, 16 or more may exist in a system. The planes are individually divided into groups of memory cells that form the minimum unit of erase, hereinafter referred to as blocks. Blocks of memory cells are shown in FIG. 3 by rectangles, such as blocks 310, 312, 314, and 316, located in respective planes 302, 304, 306, and 308. There can be any number of blocks in each plane.

The block of memory cells is the unit of erase, and the smallest number of memory cells that are physically erasable together. For increased parallelism, however, the blocks may be operated in larger metablock units. One block from each plane is logically linked together to form a metablock. The four blocks 310, 312, 314, and 316 are shown to form one metablock 318. All of the cells within a metablock are typically erased together. The blocks used to form a metablock need not be restricted to the same relative locations within their respective planes, as is shown in a second metablock 320 made up of blocks 322, 324, 326, and 328. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation. As described below, the sentinel blocks may be an individual block or a combination of blocks, including one or more metablocks.

Figure 4:
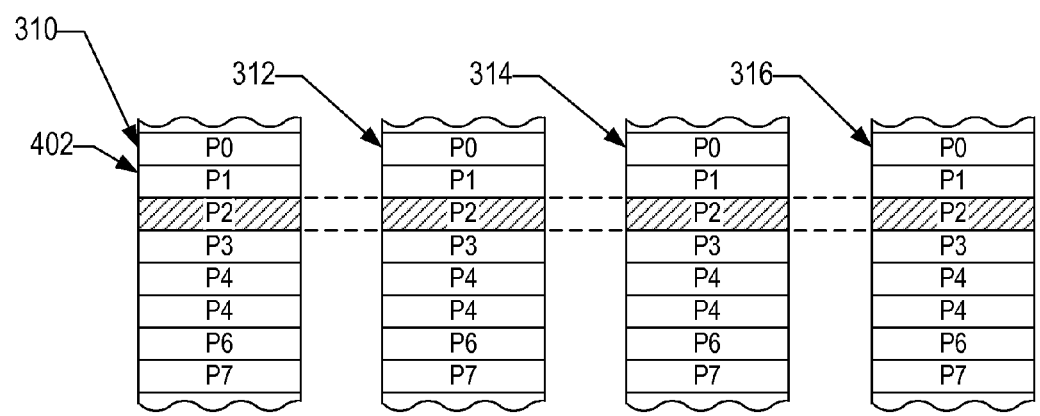
FIG. 4 is an expanded view of a portion of the physical memory of FIG. 3.

The individual blocks are in turn divided for operational purposes into pages of memory cells, as illustrated in FIG. 4. The memory cells of each of the blocks 310, 312, 314, and 316, for example, are each divided into eight pages P0-P7. Alternatively, there may be 16, 32 or more pages of memory cells within each block. The page is the unit of data programming and reading within a block, containing the minimum amount of data that are programmed or read at one time. However, in order to increase the memory system operational parallelism, such pages within two or more blocks may be logically linked into metapages. A metapage 402 is illustrated in FIG. 4, being formed of one physical page from each of the four blocks 310, 312, 314, and 316. The metapage 402, for example, includes the page P2 in each of the four blocks but the pages of a metapage need not necessarily have the same relative position within each of the blocks. A metapage may be the maximum unit of programming.

The memory cells may be operated to store two levels of charge so that a single bit of data is stored in each cell. This is typically referred to as a binary or single level cell (SLC) memory. SLC memory may store two states: 0 or 1. Alternatively, the memory cells may be operated to store more than two detectable levels of charge in each charge storage element or region, thereby to store more than one bit of data in each. This latter configuration is referred to as multi-level cell (MLC) memory. For example, MLC memory may store four states and can retain two bits of data: 00 or 01 and 10 or 11. Both types of memory cells may be used in a memory, for example binary SLC flash memory may be used for caching data and MLC memory may be used for longer term storage. The charge storage elements of the memory cells are most commonly conductive floating gates but may alternatively be non-conductive dielectric charge trapping material. In implementations of MLC memory operated to store two bits of data in each memory cell, each memory cell is configured to store four levels of charge corresponding to values of "11," "01," "10," and "00." Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page.

Figure 5:
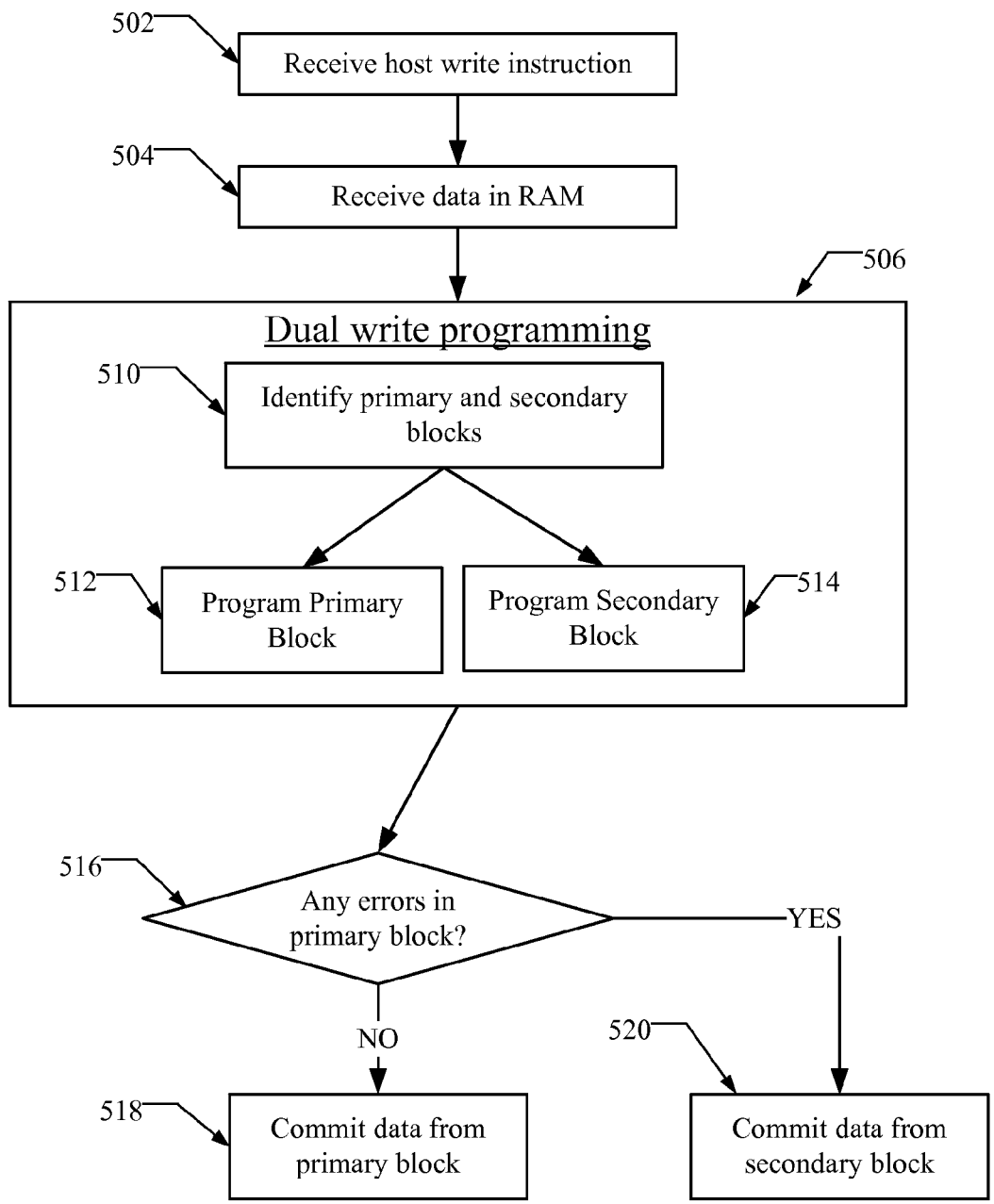
FIG. 5 is flow chart illustrating an exemplary dual programming process.

FIG. 5 is flow chart illustrating an exemplary dual programming process. FIG. 5 illustrates an exemplary process by which data protection may be achieved through the dual writing to multiple update blocks. In block 502, a host write instruction is received at the memory system (e.g. at the host interface). Based on the instruction from the host (to program certain data on the memory), the data is received in RAM in block 504. From the RAM, the memory system may utilize the dual programming in block 506. Dual programming may include simultaneous or near simultaneous programming of the same data in different blocks. The blocks that are to be used for dual programming update blocks may be identified in block 510. The host data is written to two update blocks, primary and secondary, simultaneously or substantially simultaneously. The primary block is programmed in block 512 and the secondary block is programmed in block 514.

The simultaneous programming of the secondary update block may act as a backup copy of the programmed data if there is a problem or failure with the primary update block. If there is a failure in the primary block, then the data is not lost because the secondary block may be used to retrieve the data as shown in blocks 516-520. There may be an error checking function that is performed before the data is committed to the memory from the update block. In block 516, errors in the primary block are checked, such as with enhanced post-write-read error management (EPWR). If there are no uncorrectable error codes (UECC) from EPWR in the primary block, then the data is committed from the primary block as in block 518. If there is a UECC in the primary block, then the data may be committed from the secondary block in block 520. After programming a certain number of wordlines (WLs) in the primary block, EPWR may be performed before committing the data in those WLs. If there is an UECC during EPWR or program failure or WL-WL short while programming the primary block, the data in the affected logical pages may be indexed from the secondary block, rather than the primary block. The blocks may then be cycled. The dual write programming process and cycling is further described in U.S. patent application Ser. No. 14/291,560, filed on May 30, 2014, entitled "PROTECTION SCHEME WITH DUAL PROGRAMMING OF A MEMORY SYSTEM", the entire disclosure of which is herein incorporated by reference.

Since dual writing or dual programming schemes require additional write operations and result in write amplification, it may be helpful to limit any unnecessary secondary/dual writing. This may be accomplished by recording which blocks are subject to various error correction code (ECC) errors. In one embodiment, there may be an uncorrectable ECC (UECC) list and a correctable ECC (CECC) list that records blocks with a UECC or CECC, respectively. In some instances, a reclaimed memory or refurbished memory may be utilized with dual programming to avoid a potential high rate of errors that may be common in reclaimed or refurbished memory. In particular, reclaimed flash may be less reliable, so each block may be assumed to unreliable initially.

Figure 6:
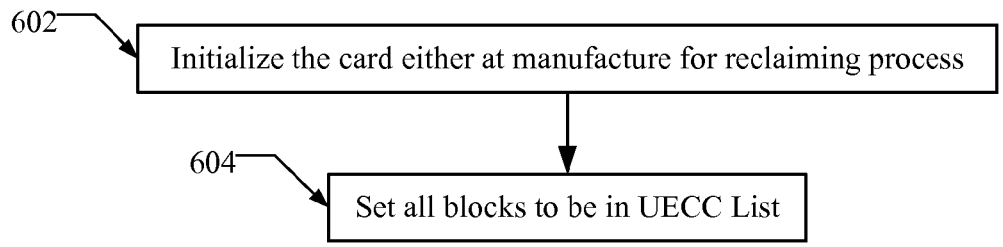
FIG. 6 is a flowchart illustrating a process for initializing ECC lists.

FIG. 6 illustrates a process for initializing ECC lists. In block 602, the card or memory device is initialized at manufacture or at another time. For this initialization, all blocks are included in the UECC list as in block 604. The assumption is that all blocks are potentially bad, but they may then be removed from the UECC list when they are determined to be good as shown in the following Figures. This is merely one example of initialization and other embodiments may sort the blocks and only put certain blocks in the UECC list or may utilize the CECC list. For example, the blocks may be segregated by multi-level cell (MLC) or single-level cell (SLC) in one embodiment (e.g. MLC in UECC list).

Figure 9:
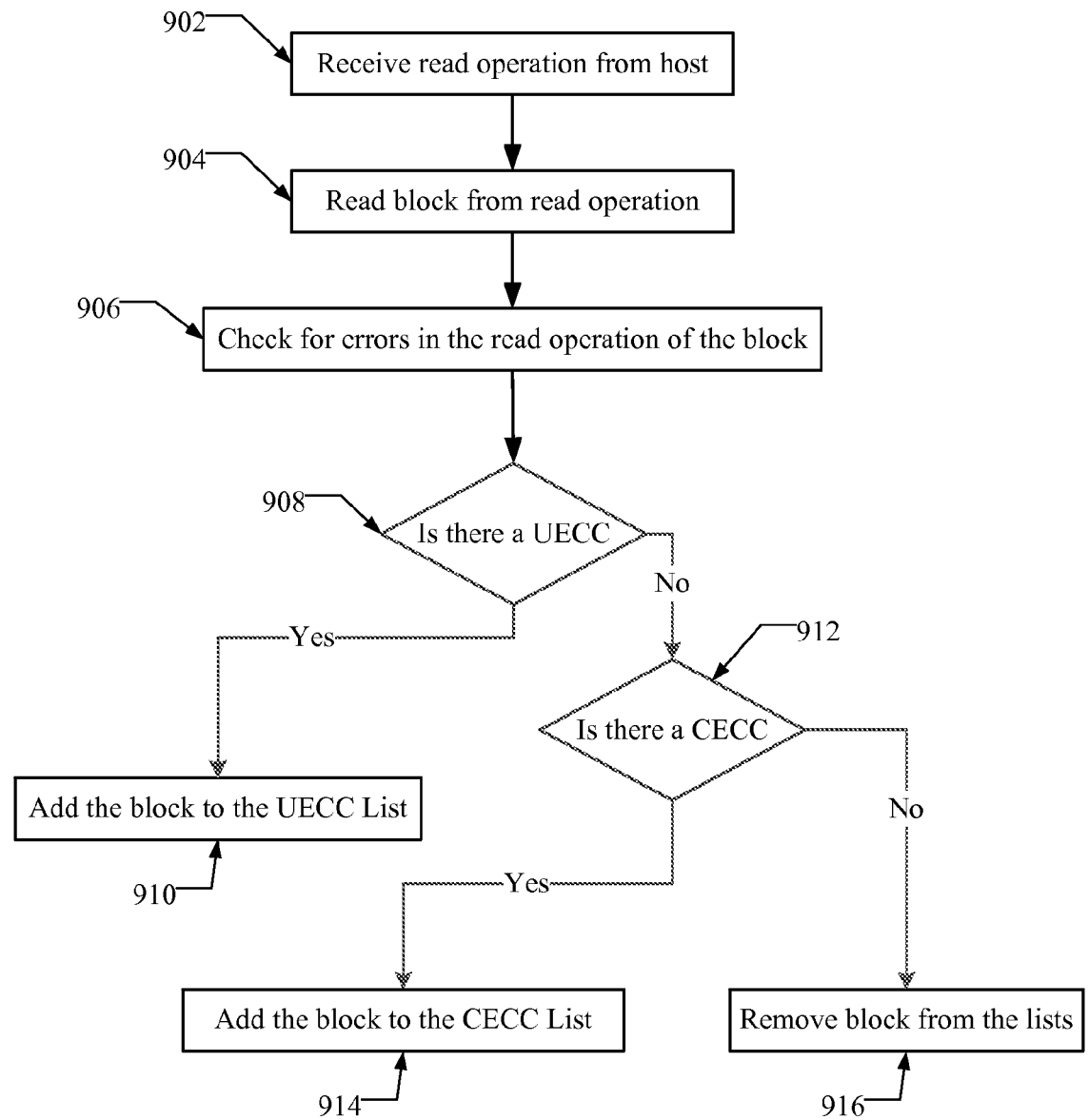
FIG. 9 is a flowchart illustrating an exemplary read operation with ECC lists.
Figure 10:
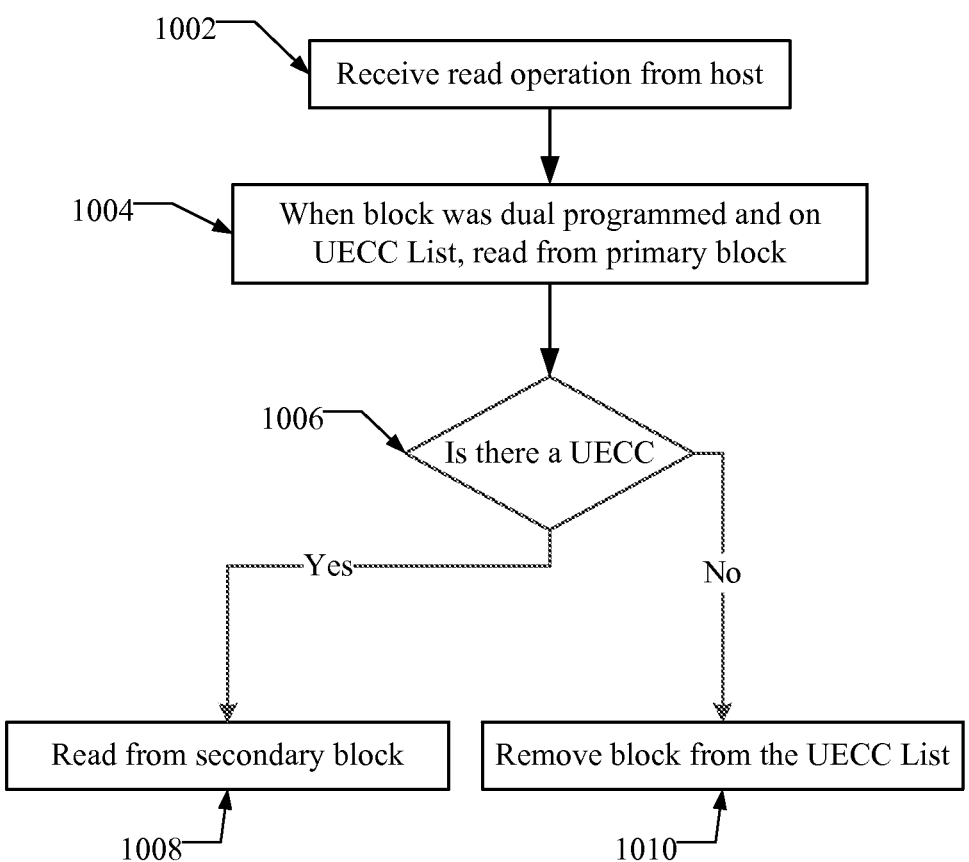
FIG. 10 is a flowchart illustrating another exemplary read operation with ECC lists.

After initialization, the blocks that are assigned to one of the ECC lists or the blocks that are not assigned to either list may be updated. This updating of the lists may be dynamic and performed as any EPWR or ECC detection is performed. FIGS. 9-10 below illustrate error determination after a read operation.

Figure 7:
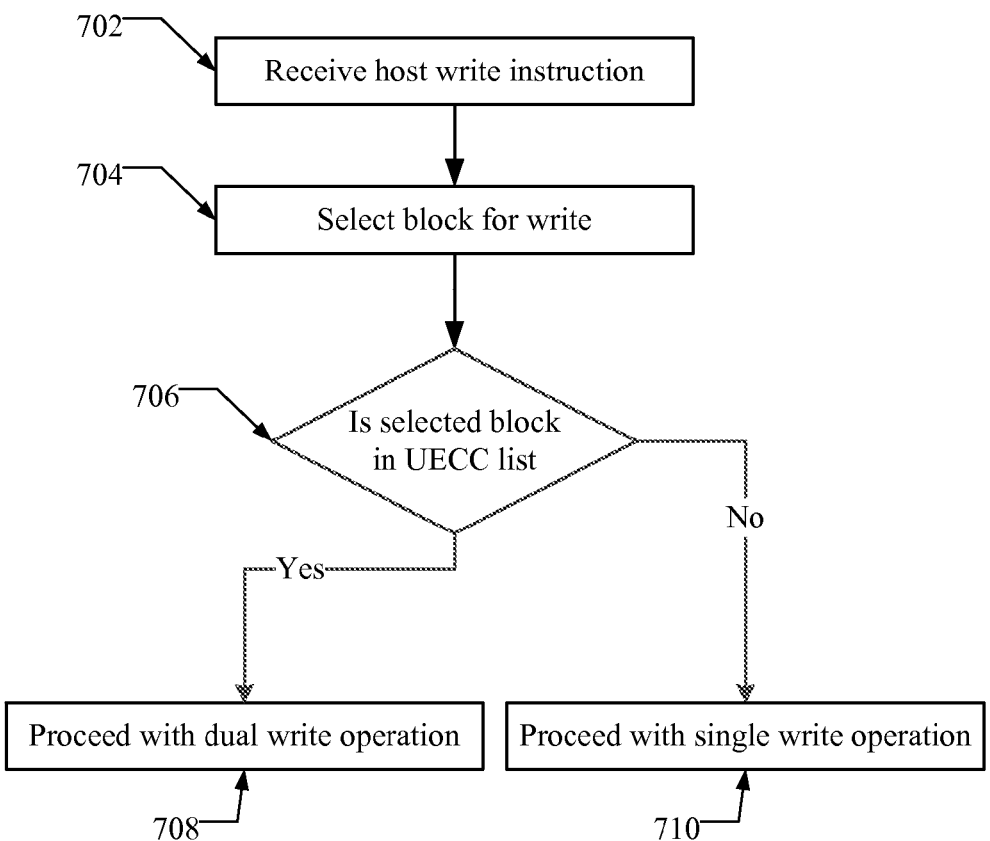
FIG. 7 is a flowchart illustrating an exemplary write operation with a UECC list.

FIG. 7 is a flowchart illustrating an exemplary write operation with an UECC list. In block 702, a write instruction is received, which may be from a host. For the write operation, a block is selected to be written in block 704. The selected block is then checked to see if it appears in the UECC list in block 706. As discussed, the UECC list may include a reference (e.g. physical or logical address) to each block that may be susceptible to errors. If the selected block is in the UECC list, then a dual write or dual programming operation is performed in block 708. The dual write operation provides insurance for potential bad data by writing to a secondary block which can be used if there are any errors when writing to the primary block. If the selected block is not in the UECC list in block 706, then a single write operation may be sufficient as in block 710. Since the block is not on the UECC list, then it is less likely to have an error in programming and can be written only once without using a secondary block as a backup.

Figure 8:
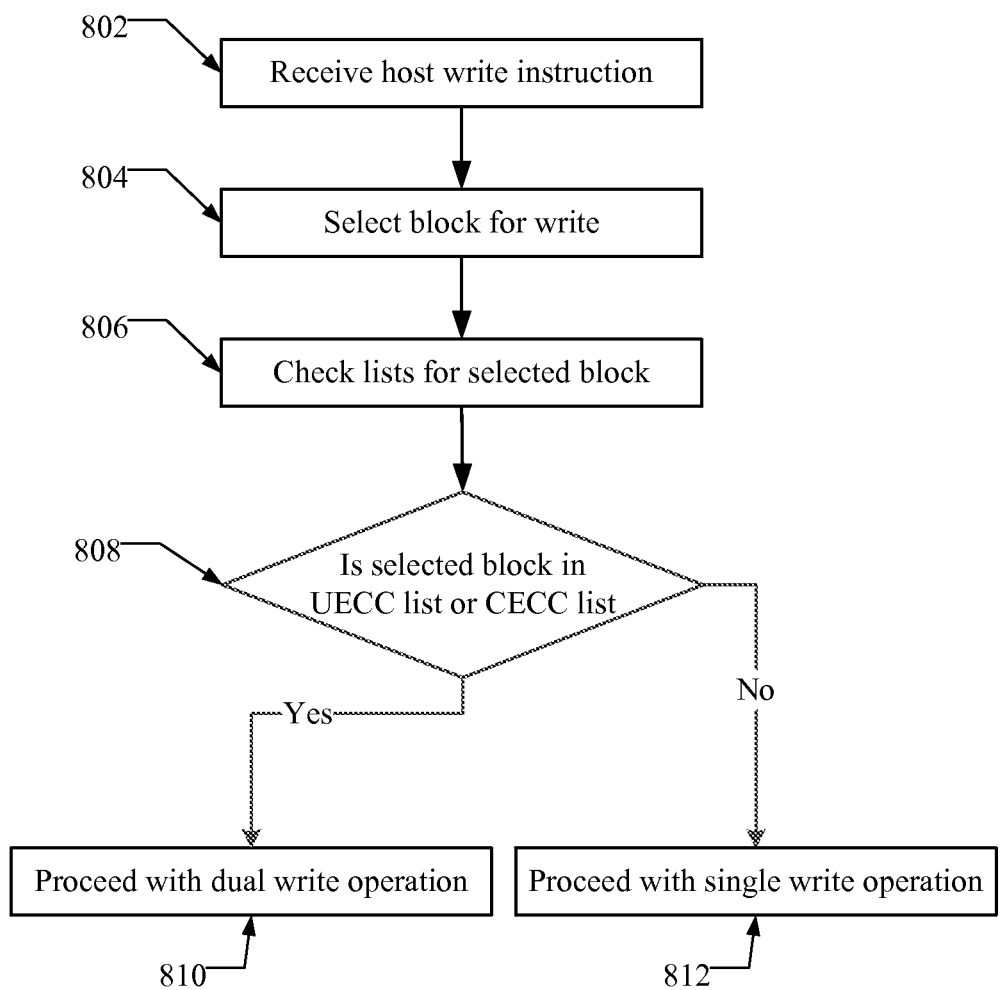
FIG. 8 is a flowchart illustrating another exemplary write operation with two ECC lists.

FIG. 8 is a flowchart illustrating another exemplary write operation with two ECC lists. FIG. 8 illustrates an example similar to FIG. 7, except there is also a CECC list in addition to a UECC list. The write instruction is received from the host in block 802 and a block is selected for writing in block 804. Both of the lists are checked to see if they include the selected block in block 806. If the selected block appears in either the UECC list or the CECC list in block 808, then a dual write operation is used in block 810. If the block does not appear in either the UECC list or the CECC list, then a single write operation is utilized in block 812. The use of a CECC list in addition to a UECC list may be for increased security. In alternative embodiments, dual write may only be required for blocks in the UECC list (as in FIG. 7) or may be required for blocks in both the UECC and CECC lists (as in FIG. 8).

FIG. 9 is a flowchart illustrating an exemplary read operation with ECC lists. In block 902, the read operation is received and the block is read in block 904. In block 906, error checking is performed based on the read operation. If there is an UECC error in block 908, then the block is added to the UECC list in block 910. If there is no UECC error in block 908, then a check is performed as to whether there is a CECC error in block 912. If there is an CECC error in block 912, then the block is added to the CECC list in block 914. If there is no CECC error in block 912, then the block is removed from both lists in block 916.

FIG. 10 is a flowchart illustrating another exemplary read operation with ECC lists. The read operation is received in block 1002. When the block was dual programmed and on the UECC list, then the read operation is from the primary block in block 1004. If there is a UECC detected for the primary block in block 1006, then the secondary block is read from in block 1008. If there is no UECC, then the block can be removed from the UECC list in block 1010.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magneto-resistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

A "computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

I claim:

1. A method for dual programming a memory using an error correction code (ECC) list comprising a list of blocks with ECC errors, the method comprising:
   receiving a write request;
   selecting at least one block for writing in response to the write request;
   checking whether the selected at least one block is on the ECC list;
   performing the dual programming of the selected at least one block when the selected at least one block is on the ECC list, wherein the dual programming comprises writing to a primary update block and a secondary update block before writing to the selected at least one block; and
   writing to the selected at least one block with single programming when the selected at least one block is not on the ECC list.

2. The method of claim 1 wherein the write request is received from a host.

3. The method of claim 1 wherein the ECC errors comprises an uncorrectable ECC (UECC) and the ECC list comprises a list of blocks with the UECC.

4. The method of claim 3 wherein blocks with a correctable ECC (CECC) are not included in the ECC list.

5. The method of claim 1 wherein the ECC list comprises a list of blocks with an uncorrectable ECC (UECC) and a correctable ECC (CECC).

6. The method of claim 1 wherein the memory comprises reclaimed memory that is initialized by listing each memory block on the ECC list.

7. The method of claim 6 further comprising:
   receiving a read request;
   performing a read operation on at least one block;
   checking for an ECC of the at least one block from the read operation;
   removing the at least one block from the ECC list when the checking indicates there is not ECC; and
   adding the at least one block to the ECC list when the checking indicates there is an ECC.

8. The method of claim 1 wherein the dual programming further comprises writing to selected at least one block from either the primary update block or the secondary update block.

9. The method of claim 1 further comprising:
   committing the data from the primary update block and erasing the secondary update block when there is not a failure with the primary update block; and
   committing the data from the secondary update block when there is a failure with the primary update block.

10. The method of claim 1 wherein the single programming comprises only committing to the selected at least one block.

11. The method of claim 1 wherein the memory comprises a three-dimensional (3D) memory configuration, and wherein a controller is associated with operation of the memory blocks.

* * * * *